United States Patent
Ghalam et al.

(10) Patent No.: US 9,443,600 B2
(45) Date of Patent: Sep. 13, 2016

(54) AUTO-SUSPEND AND AUTO-RESUME OPERATIONS FOR A MULTI-DIE NAND MEMORY DEVICE TO REDUCE PEAK POWER CONSUMPTION

(71) Applicant: Intel Corporation, Santa Clara, CA (US)

(72) Inventors: Ali Ghalam, San Jose, CA (US); Dean Nobunaga, Cupertino, CA (US); Jason Guo, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 13/852,992

(22) Filed: Mar. 28, 2013

(65) Prior Publication Data

US 2014/0293704 A1 Oct. 2, 2014

(51) Int. Cl.

| | |
|---|---|
| G11C 16/30 | (2006.01) |
| G06F 1/32 | (2006.01) |
| G11C 5/14 | (2006.01) |
| G11C 8/12 | (2006.01) |
| G11C 16/22 | (2006.01) |

(52) U.S. Cl.
CPC ............ *G11C 16/30* (2013.01); *G06F 1/3275* (2013.01); *G11C 5/148* (2013.01); *G11C 8/12* (2013.01); *G11C 16/225* (2013.01); *Y02B 60/1228* (2013.01)

(58) Field of Classification Search
CPC ....... G11C 5/144; G11C 5/145; G11C 5/148; G11C 7/20; G11C 7/222; G11C 16/0483; G11C 16/32; G11C 2207/2227; G11C 2207/22
USPC ....... 365/227, 229, 228, 226, 230.03, 51, 63
See application file for complete search history.

(56) References Cited

U.S. PATENT DOCUMENTS

| | | | | |
|---|---|---|---|---|
| 7,002,870 | B2* | 2/2006 | Hsu | ............................... 365/227 |
| 7,701,764 | B2 | 4/2010 | Nguyen | |
| 8,422,328 | B2* | 4/2013 | Kim et al. | .................... 365/226 |
| 8,745,369 | B2* | 6/2014 | Yurzola | ................. G06F 1/3275 |
| | | | | 713/100 |
| 2010/0034042 | A1 | 2/2010 | Ben-Rubi | |
| 2010/0322027 | A1* | 12/2010 | Russell et al. | ................ 365/227 |
| 2012/0023348 | A1 | 1/2012 | Byom et al. | |
| 2012/0221880 | A1 | 8/2012 | Kim et al. | |
| 2012/0290864 | A1 | 11/2012 | Seroff | |
| 2012/0331282 | A1 | 12/2012 | Yurzola et al. | |

OTHER PUBLICATIONS

International Search Report and Written Opinion received for PCT Patent Application No. PCT/US2014/016281, mailed on May 20, 2014, 13 pages.
International Preliminary Report on Patentability received for International Application No. PCT/US2014/016281, mailed on Oct. 8, 2015, 10 pages.
Office Action received for Korean Patent Application No. 10-2015-7023089, mailed on Apr. 29, 2016, 6 pages including 1 page of English translation.

* cited by examiner

*Primary Examiner* — Andrew Q Tran
(74) *Attorney, Agent, or Firm* — Alpine Technology Law Group LLC

(57) ABSTRACT

A method and apparatus that controls a peak-current condition in a multi-die memory, such as a solid-state drive, by determining by at least one die of the multi-die memory whether a subsequent memory operation is a high-current memory operation, such as an operation to enable a charge pump of the die, an operation to charge a bit line of the die, or a program/erase loop operation, or a combination thereof. The die enters a suspended-operation mode if the subsequent memory operation is determined to be a high current memory operation. Operation is resumed by the die in response to a resume operation event, such as, but not limited to, a command specifically address to the die, an indication from another die that a high-current memory operation is complete. Once operation is resumed, the die performs the high-current memory operation.

16 Claims, 9 Drawing Sheets

AUTO-SUSPEND AND AUTO-RESUME OPERATIONS FOR A MULTI-DIE NAND MEMORY DEVICE TO REDUCE PEAK POWER CONSUMPTION

TECHNICAL FIELD

Embodiments of techniques described herein relate to multi-chip non-volatile memory, and more particularly, to reducing peak power consumption during execution of memory command by NAND flash memories of a multi-chip (multi-die) NAND flash memory device.

BACKGROUND

The peak power consumption per die of a multi-NAND device (multi-die configuration) should be controlled in some manner in order to meet the overall power consumption constraints for the multi-NAND device. One conventional approach that has been used to decrease the combined peak-power consumption of a multi-die configuration adversely impacts the overall execution durations of some NAND memory operations.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
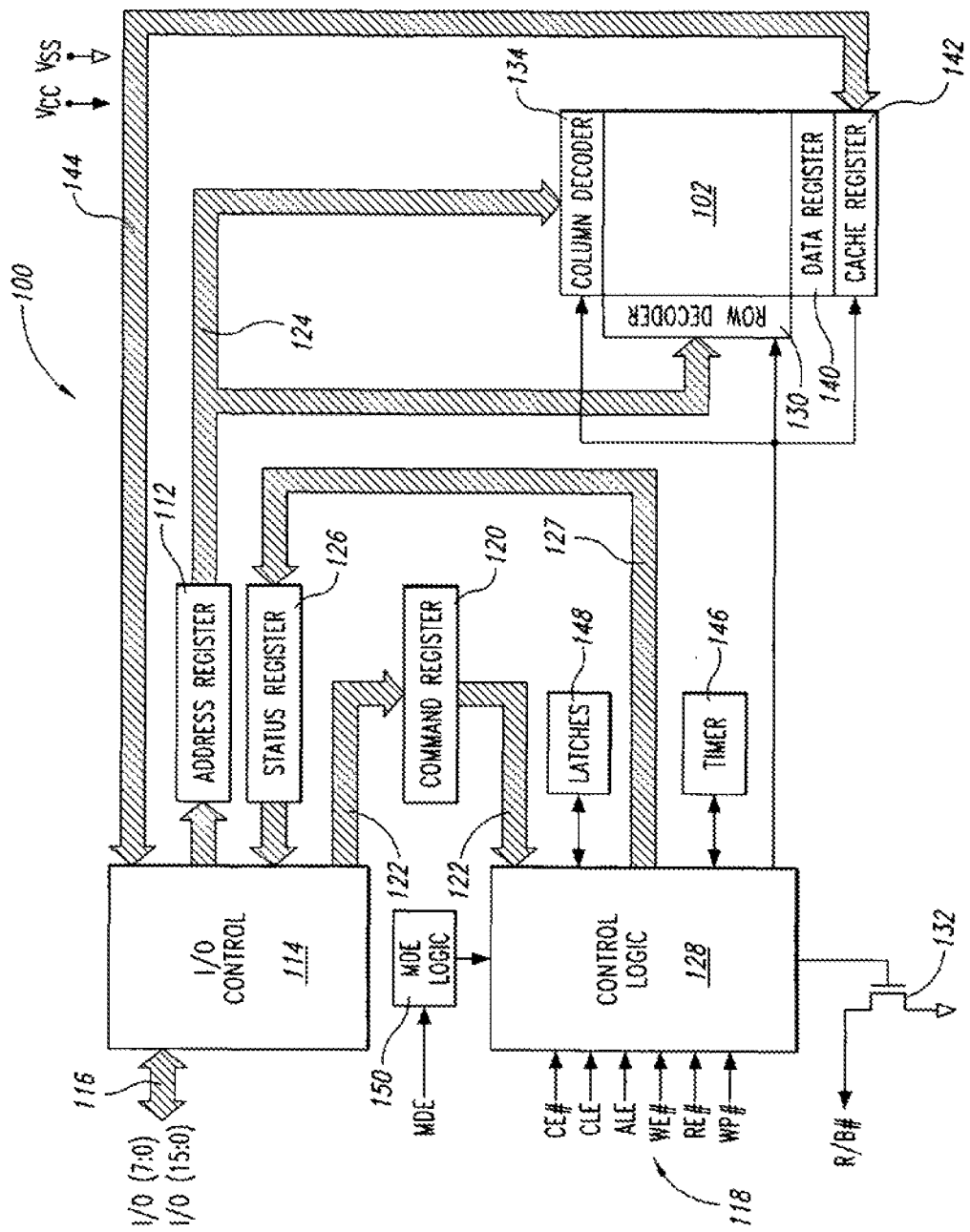
FIG. 1 depicts a simplified block diagram of a portion of an exemplary embodiment of NAND flash memory according to the subject matter disclosed herein.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DESCRIPTION OF THE EMBODIMENTS

Embodiments of techniques described herein relate to semiconductor fabrication and, more particularly, to fabricating vertical NAND strings. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

According to embodiments of the subject matter disclosed herein, power-consumption peaks of a multi-NAND device (multi-die configuration) that occur during concurrent operations of the multiple NAND die are controlled and managed by automatically suspending operation of a die at one or more predetermined operational points. Each NAND die is then controlled to resume operation based on determined system conditions to thereby temporally vary the current/power peaks of the respective die without adversely impacting the overall execution durations of some NAND memory operations.

FIG. 1 depicts a simplified block diagram of a portion of an exemplary embodiment of NAND flash memory 100 according to the subject matter disclosed herein. In one exemplary embodiment, NAND flash memory 100 comprises part of a multi-die configuration, such as, but not limited to, a solid-state memory array or a solid-state drive.

NAND flash memory 100 has been simplified in FIG. 1 to focus on features of the memory that are helpful in understanding the subject matter disclosed herein. It should be understood that a more detailed understanding of internal circuitry and functions of flash memories are known to those skilled in the art.

Memory 100 includes a memory array 102 comprising a plurality of memory cells arranged in row and column fashion. In one exemplary embodiment, each of the memory cells includes a floating-gate (FG) field-effect transistor capable of holding a charge for the non-volatile storage of data. In another exemplary embodiment, each of the memory cells includes a charge flash trap (CFT) device structure. Each of the cells can be electrically programmed on an individual basis by charging the floating gate. The rows of memory array 102 are arranged in blocks in which a memory block is some discrete portion of memory array 102. The memory cells generally can be erased in blocks. Data, however, may be stored in the memory array 102 in finer increments than a memory block. Row decoder and column decoder circuits 130, 134 decode memory addresses to access the corresponding memory locations in memory array 102. In one exemplary embodiment, data register 140 and optional cache register 142 temporarily store data read from, or to be written to the memory array 102.

Command, data and address signals are provided to an I/O control 114 on device bus 116, which is multiplexed for receiving the various signals. Which particular signal of the various signals that are being received is determined by control signals 118 that are provided to a control logic 128. In response to control signals 118 indicating that command signals are being provided on device bus 116 to I/O control 114, the command signals are received by I/O control 114 and the corresponding commands are latched by a command register 120. A latched command is provided to control logic 128 via an internal command bus 122. Control logic 128 decodes the commands and corresponding internal control signals are generated by control logic 128 to perform the requested commands. In response to control signals 118 indicating that address signals are being provided on device bus 116 to I/O control 114, the address signals are received and the corresponding addresses are latched in an address register 112. A status register 126 is used to latch status information provided to the control register over an internal status bus 127 from control logic 128. The status information is generated by control logic 128 in response to receiving a command requesting the status of an operation. In one exemplary embodiment, control logic 128 can comprise an internal oscillator (not shown) that generates an internal clock for synchronizing internal operations of NAND flash memory 100 in response to receiving a command.

In one exemplary embodiment, control logic 128 is coupled to a transistor 132 to provide a ready/busy signal R/B# that can be used for indicating completion of various memory operations, in which "#" corresponds to a particular die identification. The R/B# signal is typically HIGH, and transitions to LOW after a command is written to NAND flash memory 100. When a current memory operation is completed, the R/B# signal transitions back to HIGH.

A timer 146 coupled to control logic 128 can be used for timing a time delay. As will be described in more detail below, timer 146 can be used for selectively delaying a resume operation by the individual NAND flash memories of a multi-chip NAND flash memory to avoid having all of the NAND flash memories begin initiating a resume operation at the same time. Timer 146 is conventional and can be implemented using well-known circuits and designs. Control logic 128 is further coupled to multi-die enable (MDE) logic 150. MDE logic receives an MDE signal that is used to identify the particular NAND flash memory 100 for multi-chip applications. For example, in a multi-chip application having four NAND flash memories, the input to MDE logic 150 for one of the memory can be coupled to a supply voltage VCC and the input to MDE logic 150 for the other memories can be coupled to ground VSS. Based on the signal applied to MDE logic 150, control logic 128 is provided with identification information for the NAND flash memory. In configurations in which a greater number of NAND flash memories are used, MDE logic 150 can be modified to receive more signals so that each of the memories can be uniquely identified, as known in the art.

Latches 148 coupled to control logic 128 are used for storing various information regarding the state of NAND flash memory 100. Each of the latches included in latches 148 can be set by control logic 128 to a first state or a second state. Based on the state of the latch, control logic 128 can determine a mode of operation of the memory (e.g., set to the first state to indicate a first mode of operation and set to the second state to indicate a second mode of operation) or whether an event has occurred (e.g., set to the first state upon initial power-up of memory 100 and set to a second state after the event has occurred). Latches 148 are conventional, and can be designed and operated as well known to those ordinarily skilled in the art.

In operation, memory array 102 can be accessed by providing a combination of control, command, and address signals. For example, to perform a read operation, a first combination of control signals 118 is provided to control logic 128 to indicate that command signals are applied to device bus 116. Control logic 128 generates internal control signals for I/O control 114 to receive the command signals and for the corresponding command to be latched in command register 128. Control logic 128 decodes the read command and begins to generate internal control signals for accessing memory array 102.

A second combination of control signals 118 is provided to control logic 128 to indicate that address signals are applied to device bus 116. Control logic generates internal control signals for I/O control 114 to receive the address signals and for the corresponding addresses to be latched in address register 112. The addresses are provided to a row decoder circuit 130 and a column decoder circuit 134 via an internal address bus 124 for decoding the addresses and accessing the memory locations corresponding to the latched addresses.

A page of memory cells having the memory locations to be accessed is read from the memory array 102 and stored in a data register 140. The data from the page of memory is transferred to a secondary (and optional) cache register 142 before being provided to I/O control 114 on an internal data bus 144. The cache register can be used to temporarily store the page of data in order to free data register 140 to store another page of data for a subsequent access operation of memory array 102. The page of data is transferred to I/O control 114 from the cache register 142. Based on the addresses, the appropriate data from the page of data is output on device bus 116.

A write operation occurs in a similar manner except that following the second combination of control signals a third combination of control signals are provided to control logic 128 indicating that data to be written to the memory locations corresponding to the addresses is being provided on device bus 116. The data received by I/O control 114 is provided on internal data bus 144 to cache register 142 for writing to memory array 102.

Figure 2:
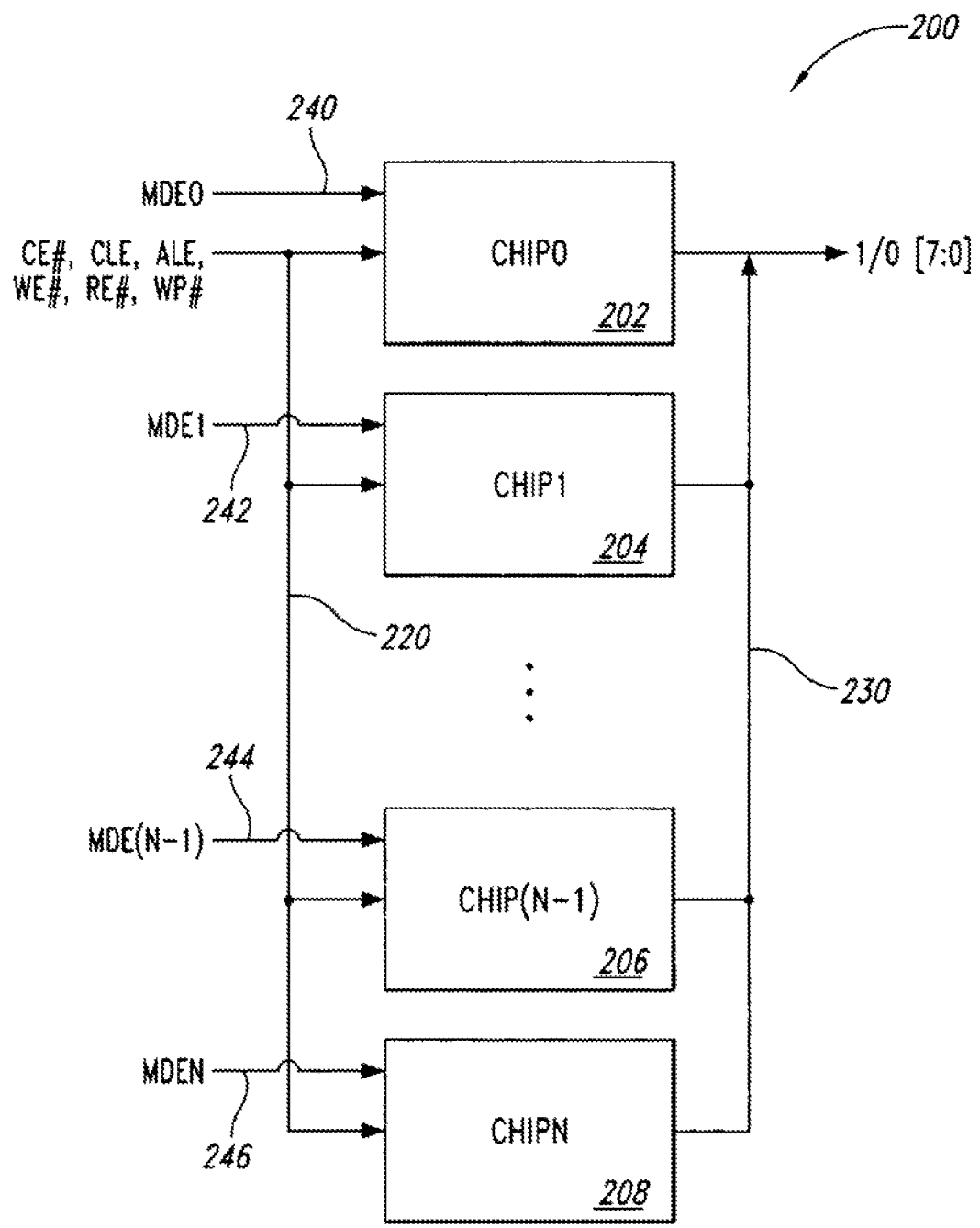
FIG. 2 depicts another exemplary embodiment of a multi-chip NAND flash memory according to the subject matter disclosed herein.

FIG. 2 depicts another exemplary embodiment of a multi-chip NAND flash memory 200 according to the subject matter disclosed herein. In one exemplary embodiment, NAND flash memory 200 comprises part of a multi-die configuration, such as, but not limited to, a solid-state memory array or a solid-state drive. Multi-chip memory 200 includes N separate NAND flash memories 202-208 sharing a control bus 220 and an input-output (I/O) bus 230. NAND flash memories 202-208 are typically included in a single device package to provide high-density, small form factor, multi-chip memory.

In one exemplary embodiment, each of the NAND flash memories 202-208 are conventionally programmed or have the respective MDE logic 150 electrically connected to have unique identification information. In alternative embodiments, non-volatile chip identification latches included in latches 148 are programmed with the identification information. As depicted in FIG. 2, the first NAND flash memory 202 is identified as Die0 (Chip0) and the second NAND flash memory 204 is identified as Die1 (Chip1). The remaining NAND flash memories are identified by an increasing chip number, with the last two devices 206 and 208 respectively identified as Die(N−1) and DieN (Chip(N−1) and ChipN).

An external memory controller (not shown) provides combinations of control signals over control bus 220, and command, address and data signals over I/O bus 230 to perform various memory operations. Control bus 220 includes signal lines for providing various control signals to each device. Examples of control signals are CE#, CLE, ALE, WE#, RE#, and WP#, in which "#" in the various control signals corresponds to a particular die identification. It should be understood that other control signals may also be utilized. In the exemplary embodiment depicted in FIG. 2, separate MDE signals are provided to NAND flash memories 202-208 on MDE terminals 240, 242, 244, and 246, respectively, for setting the identification information for each of the respective NAND flash memories 202-208. The I/O bus 230 includes multiple signal lines and is shown as an eight-bit wide bus I/O[7:0]. I/O busses of different bit-widths could alternatively be used as well.

In operation, control, command, address, and data signals are provided to all of the NAND flash memories 202-208 on control and I/O busses 220, 230. Only those memories that are activated by the respective CE# signal, however, will receive and respond to the signals.

In one exemplary embodiment, a global memory command can be issued from the memory controller by activating all of the NAND flash memories 202-208 and providing the appropriate control and command signals on control and I/O busses 220, 230. Each of the NAND flash memories 202-208 begins executing the memory command in response to memory command, which can place significant peak power demands on a power supply (not shown) coupled to a multi-die NAND memory 200. Such a situation is particularly undesirable in applications in which power is provided by a battery or another limited source of power. Because a NAND die operation may be synchronous (i.e., driven by the internal oscillator of the die), events, such as current peaks, could occur during concurrent operations on multiple NAND die. In one exemplary embodiment, each die automatically suspends operation prior to performing an operation that generates a peak-current event. For example, each die automatically suspends operation prior to, but not limited to, an operation that enables the charge pumps of the die, a bit line (BL) precharge operation, or a program/erase loop operation, or combinations thereof.

Figure 3:
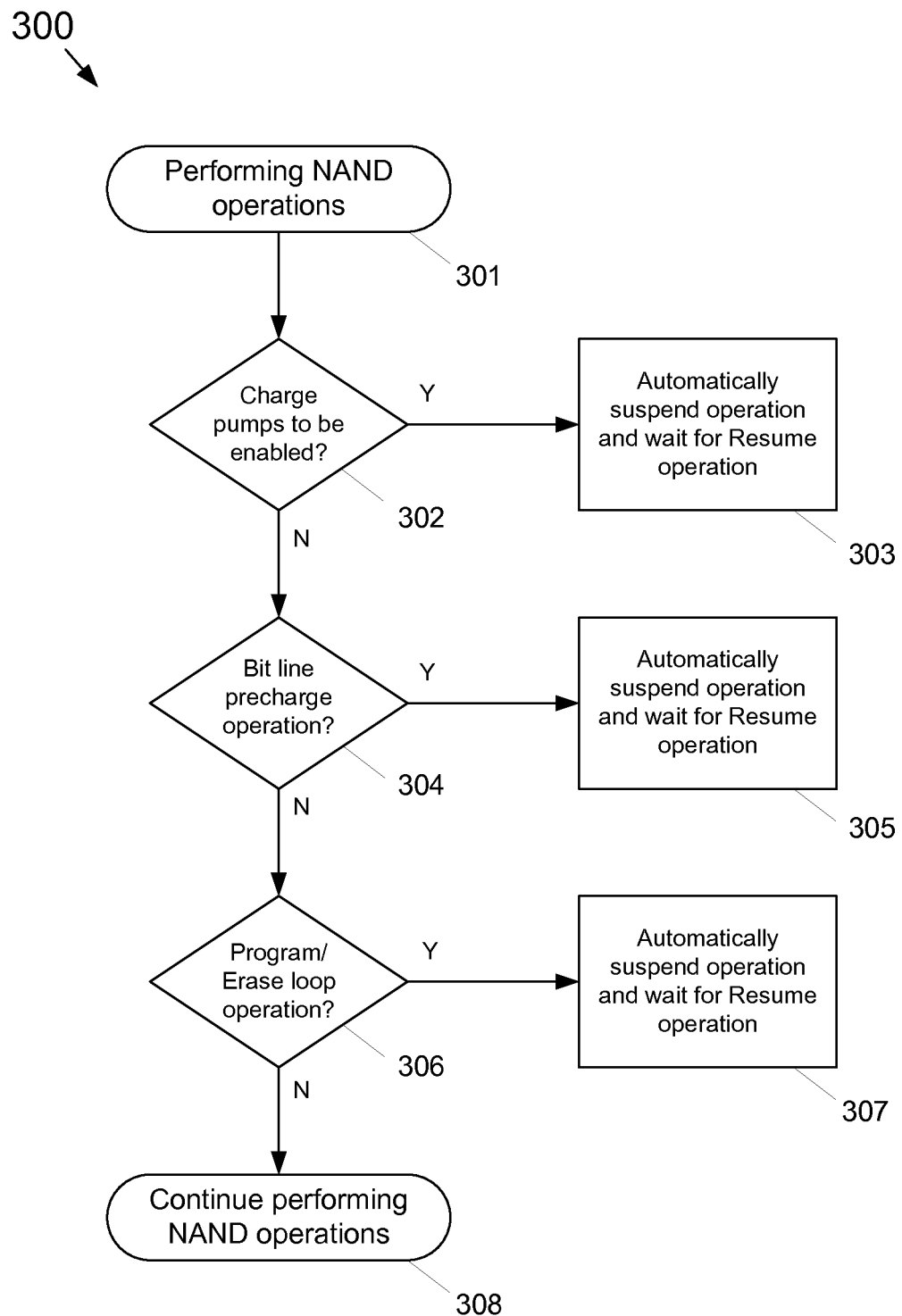
FIG. 3 depicts a flow diagram of an exemplary embodiment of a portion of an NAND operation that is performed by a die of a multi-chip NAND flash memory of FIG. 2 that automatically suspends operation prior to performing an operation that generates a peak-current event according to the subject matter disclosed herein.

FIG. 3 depicts a flow diagram 300 of an exemplary embodiment of a portion of an NAND operation that is performed by a die of a multi-chip NAND flash memory 200 that automatically suspends operation prior to performing an operation that generates a peak-current event according to the subject matter disclosed herein. It should be understood that although three specific peak-current events are identified in FIG. 3, the subject matter disclosed herein is not so limited and additional and/or other peak-current events could be included in FIG. 3. At 301, the die is performing NAND operations. At 302, it is determined whether an operation is to be performed that enables the charge pumps of the die. If, at 302, it is determined that an operation is to be performed that enables the charge pumps, flow continues to 303 where operation is automatically suspended until a resume operation command is received or a resume operation event occurs.

If, at 302, it is determined that an operation to enable the charge pumps is not to be performed, flow continues to 304 where it is determined whether an operation is to be performed that precharges a bit line (BL). If, at 304, it is determined that an operation is to be performed that precharges a bit line, flow continues to 305 where operation is automatically suspended until a resume operation command is received or a resume operation event occurs.

If at 304, it is determined that an operation that precharges a bit line is not to be performed, flow continues to 306 where it is determined whether an operation is to be performed that is a program/erase loop operation. If, at 306, it is determined that a program/erase loop operation is to be performed, flow continues to 307 where operation is automatically suspended until a resume operation command is received or a resume operation event occurs.

If at 306, it is determined that a program/erase loop operation is not to be performed, flow continues to 308 where NAND operations are continued to be performed.

According to the subject matter disclosed herein, the exemplary ways that a resume operation can occur include, but are not limited to, receipt of a die-specific resume command from a system controller, occurrence of a resume operation event that is based on expiration of a system timer/clock and/or an internal-die timer/clock, receipt of a system-wide power-management command issued to all die and die-specific outputs that control a resume operation in other die, and receipt of a die-specific resume command from a system controller in response to the indicated high-current status of a register in a die.

Figure 4:
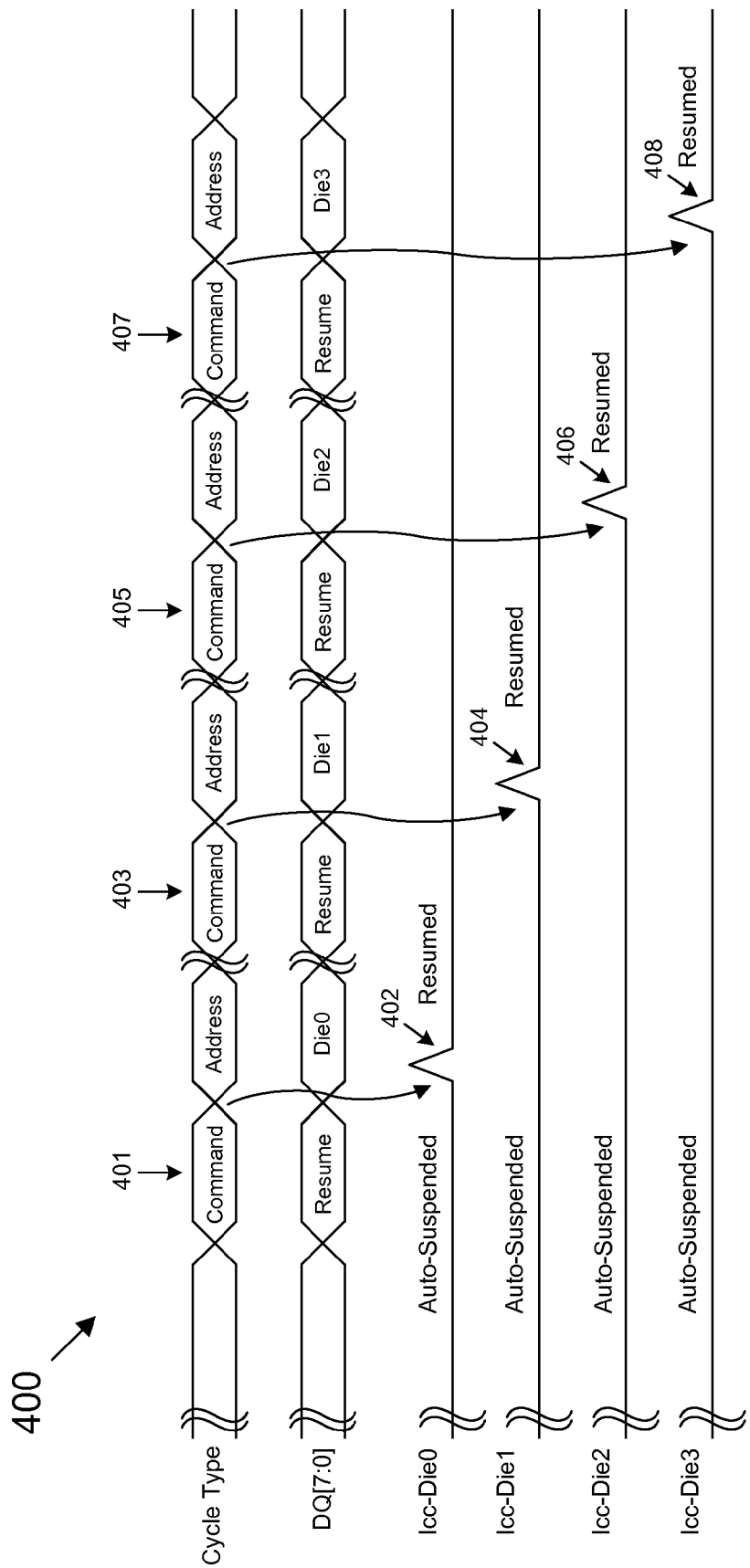
FIG. 4 depicts an exemplary timing diagram for a receipt of a die-specific resume command from a system controller for an exemplary four-die multi-chip NAND flash memory according to the subject matter disclosed herein.

FIG. 4 depicts an exemplary timing diagram 400 for a receipt of a die-specific resume command from a system controller (host controller) for an exemplary four-die multi-chip NAND flash memory according to the subject matter disclosed herein. It should be understood that a multi-chip NAND flash memory having a number of dies different from four dies could be used. As depicted in FIG. 4, Die0-Die3 are in an auto-suspend state based on, for example, executing operations corresponding to the flow diagram of FIG. 3 that indicate, for example, that a bit line (BL) precharge operation is to occur. Die currents Icc-Die0 through Icc-Die3 are indicated in FIG. 4 to be at a low-current state.

At 401, the system controller issues a resume command on data lines DQ[7:0] specifically addressed to Die0. In response, Die0 resumes operation at 402 and a high-current condition caused by a bit line precharge occurs as represented by the triangular-shaped spike. At a later time, the system controller issues a resume command at 403 on data lines DQ[7:0] specifically addressed to Die1. In response, Die1 resumes operation at 404 and a high-current condition occurs caused by a bit line precharge. At a still later time, the system controller (host controller) issues a resume command at 405 on data lines DQ[7:0] specifically addressed to Die2. In response, Die2 resumes operation at 406 and a high-current condition occurs caused by a bit line precharge. To complete the explanation, at an even later time, the system controller issues a resume command at 407 on data lines DQ[7:0] specifically addressed to Die3. In response, Die3 resumes operation at 408 and a high-current condition occurs caused by a bit line precharge. The resume commands are issued by the system controller with appropriate timing to avoid a high-current condition that exceeds the overall power consumption constraints for the multi-die device.

Figure 5:
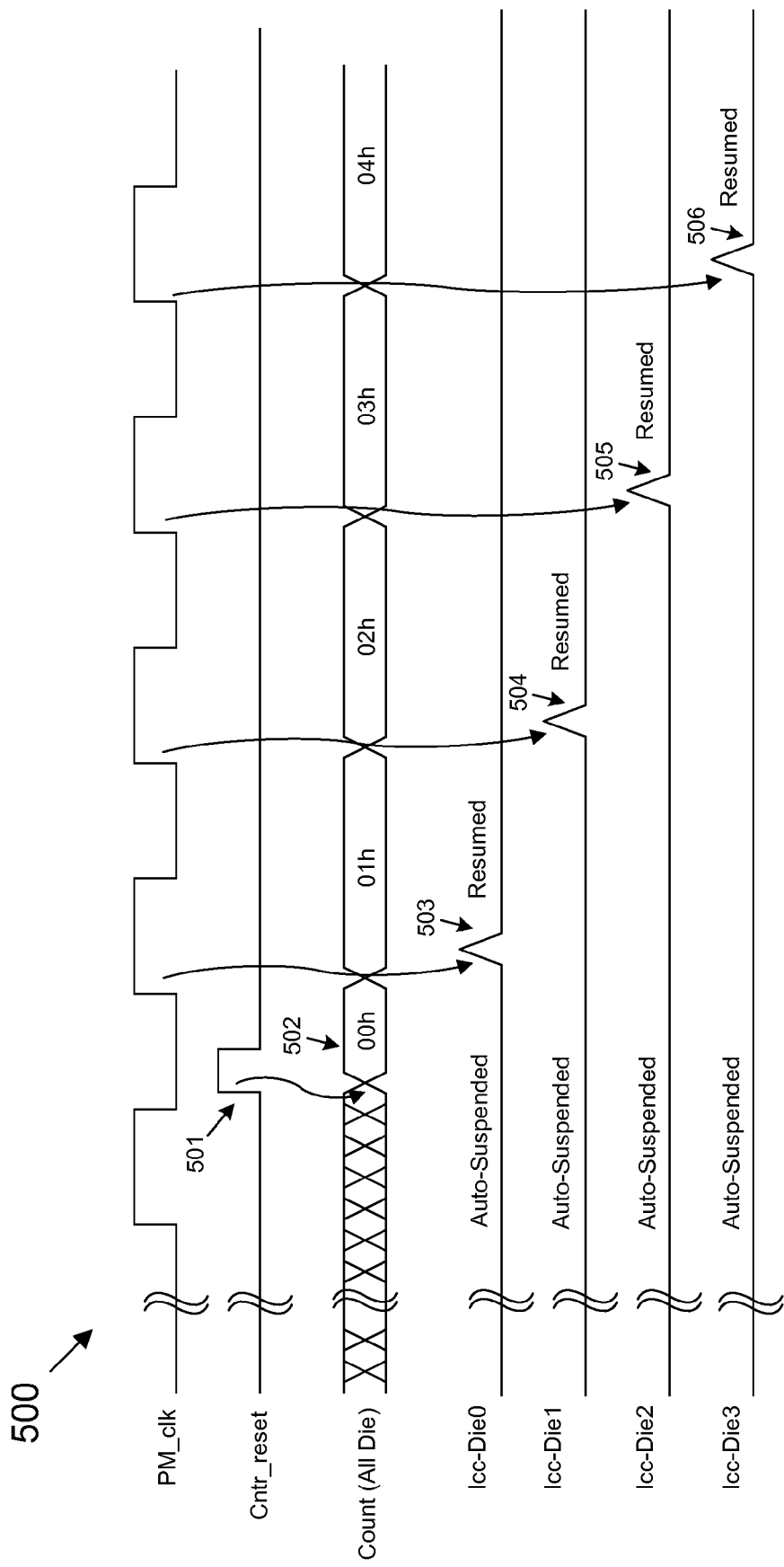
FIG. 5 depicts an exemplary timing diagram for resume events based on a system-generated clock for an exemplary four-die multi-chip NAND flash memory according to the subject matter disclosed herein.

FIG. 5 depicts an exemplary timing diagram 500 for resume events based on a system-generated clock for an exemplary four-die multi-chip NAND flash memory according to the subject matter disclosed herein. It should be understood that a multi-chip NAND flash memory having a number of dies different from four dies could be used. As depicted in FIG. 5, Die0-Die3 are in an auto-suspend state based on, for example, executing operations corresponding to the flow diagram of FIG. 3 that indicate, for example, that a bit line (BL) precharge operation is to occur. Die currents Icc-Die0 through Icc-Die3 are indicated in FIG. 5 to be at a low-current state.

At 501 a counter reset Cntr_reset signal is issued by the system controller, which causes all of the internal-die counters of the respective dies to be reset to 00h at 502. Each internal-die counter has been individually trimmed during fabrication to be reset to a different timing value. Each internal-die counter is also responsive to count in a well-known manner to a system-generated power-management signal PM_clk. In one exemplary embodiment, the Cntr_reset signal should be issued in a proper timing relationship with a power-management signal PM_clk. When the internal-die counter for Die0 equals, for this example, 01h, die0 resumes operation at 503 and a high-current condition occurs caused by a bit line precharge. When the internal-die counter for Die1 equals 02h, die1 resumes operation at 504 and a high-current condition occurs caused by a bit line precharge. When the internal-die counter for Die2 equals 03h, die1 resumes operation at 505 and a high-current condition occurs caused by a bit line precharge, and when the internal-die counter for Die3 equals 04h, die3 resumes operation at 506 and a high-current condition occurs caused by a bit line precharge. The rate of PM_clk and the selected count value of each internal-die counter should be selected to provide appropriate timing to avoid a high-current condition that exceeds the overall power consumption constraints for the multi-die device.

Figure 6:
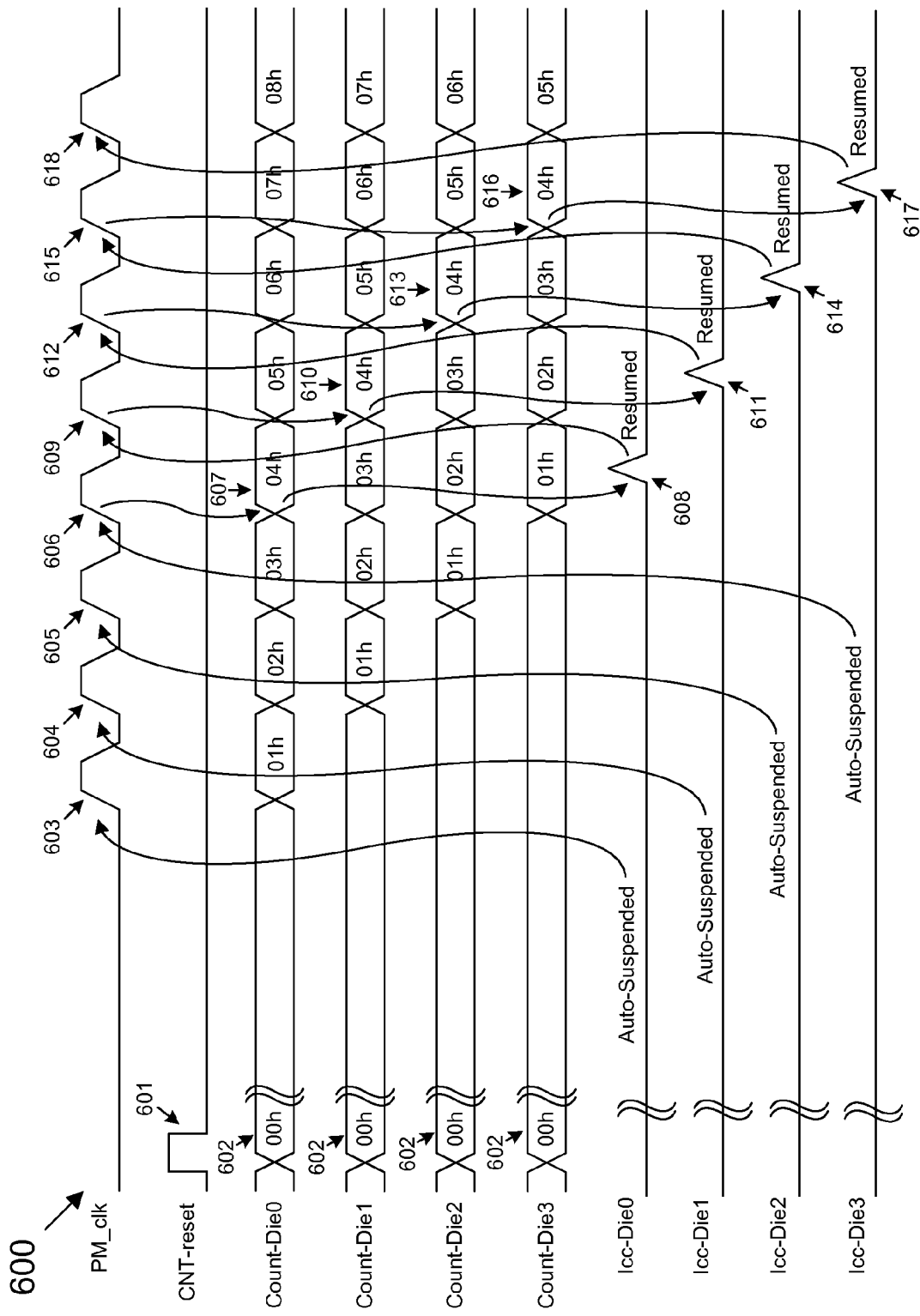
FIG. 6 depicts an exemplary timing diagram for resume events based on a die-toggled clock for an exemplary four-die multi-chip NAND flash memory according to the subject matter disclosed herein.

FIG. 6 depicts an exemplary timing diagram 600 for resume events based on a die-toggled clock for an exemplary four-die multi-chip NAND flash memory according to the subject matter disclosed herein. It should be understood that a multi-chip NAND flash memory having a number of dies different from four dies could be used. As depicted in FIG. 6, Die0-Die3 are in an auto-suspend state based on, for example, receiving a Cntr_reset signal from a system controller (host controller) and executing operations corresponding to the flow diagram of FIG. 3 that indicate, for example, that a bit line (BL) precharge operation is to occur. Die currents Icc-Die0 through Icc-Die3 are indicated in FIG. 6 to be at a low-current state.

More specifically, at 601 a counter reset signal CNT_reset is issued by the system controller, which causes all of the internal-die counters of the respective dies to be reset to 00h at 602. In one exemplary embodiment, the CNT_reset signal also enables the auto-suspend mode for Die0-Die3. Additionally, each internal-die counter has been individually trimmed during fabrication to be reset to a different timing value, and each internal-die counter is responsive in a well-known manner to a system clock PM_clk to count. When Die0 enters the auto-suspend state, a power-management signal PM_clk, that is available system wide, is toggled at 603 and the internal-die counter of Die0 begins to count. Similarly, when each Die1-Die3 enters the auto-suspend state, PM_clk is toggled (events 604, 605 and 606). Although the toggling of PM_clk is depicted as being regularly spaced in time, it should be understood that the toggling will be a function of when each respective die determines that is should enter an auto-suspend state. PM_clk continues to be toggled and eventually the internal-die counter of Die0 becomes, for this example, 04h at 604, Die0 resumes operation at 607 and a high-current condition occurs caused by a bit line precharge. The high-current condition at 608 is detected and causes PM_clk to toggle at 609. When the internal-die counter of Die1 becomes 04h at 610, die1 resumes operation at 611 and a high-current condition occurs caused by a bit line precharge. The high-current condition at 611 is detected and causes PM_clk to toggle at 612. When the internal-die counter of Die2 becomes 04h at 613, die1 resumes operation at 614 and a high-current condition occurs caused by a bit line precharge. The high-current condition at 614 is detected and causes PM_clk to toggle at 615. When the internal-die counter of Die3 becomes 04h at 616, die1 resumes operation at 617 and a high-current condition occurs caused by a bit line precharge. The high-current condition at 614 is detected and causes PM_clk to toggle at 618. The process continues on in the same manner. The toggle rate of PM_clk and the selected count value of each internal-die counter should be selected to provide appropriate timing to avoid a high-current condition that exceeds the overall power consumption constraints for the multi-die device.

Figure 7:
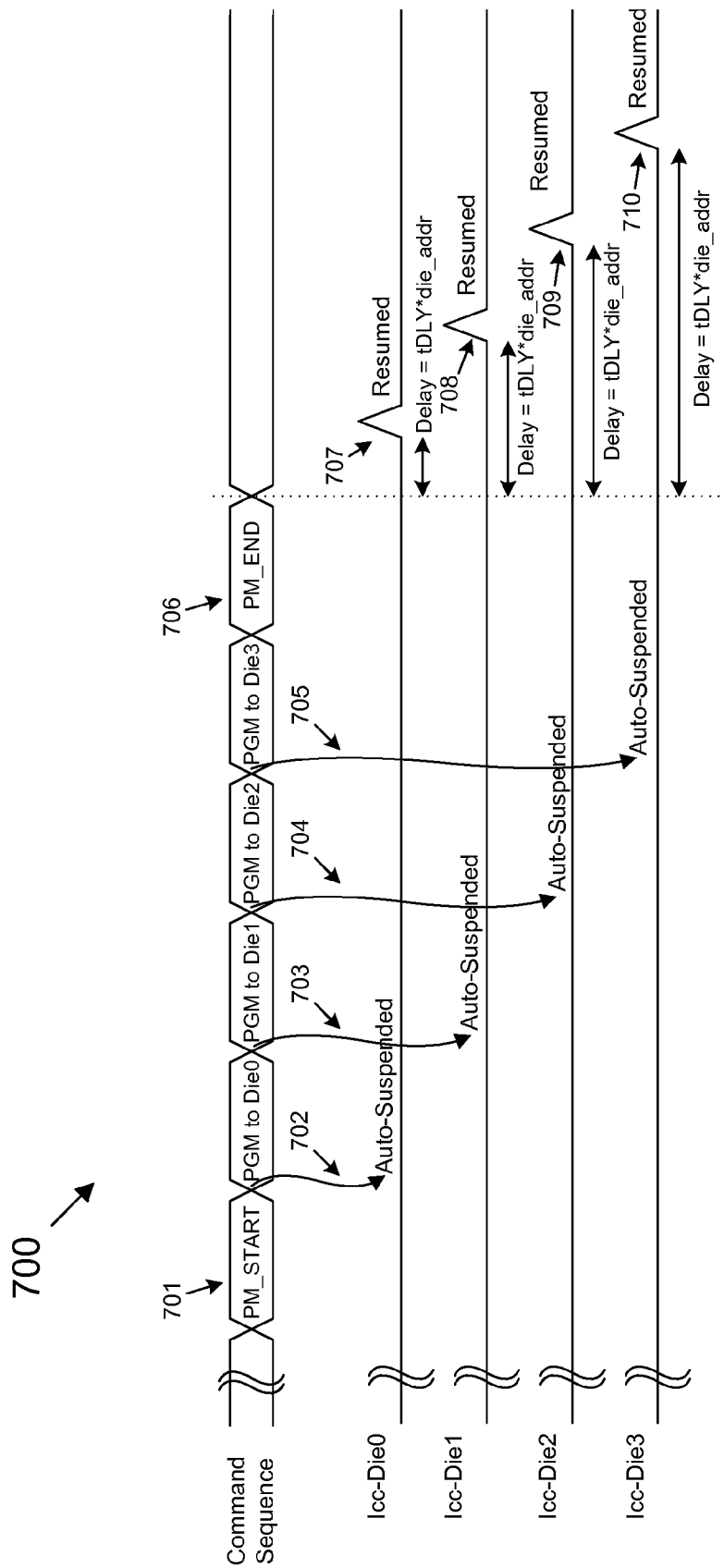
FIG. 7 depicts an exemplary timing diagram of a power-management mode for an exemplary four-die multi-chip NAND flash memory according to the subject matter disclosed herein

FIG. 7 depicts an exemplary timing diagram 700 of a power-management mode for an exemplary four-die multi-chip NAND flash memory according to the subject matter disclosed herein. It should be understood that a multi-chip NAND flash memory having a number of dies different from four dies could be used. As depicted in FIG. 7, Die0-Die3 are initially in a normal operation mode (i.e., not auto-suspended). Die currents Icc-Die0 through Icc-Die3 are indicated in FIG. 7 to be at a low-current state.

After receiving the power-management command at 701, all of the die respectively suspend any subsequent operation prior to a pre-defined high-current operation (702-705). Although the respective die are shown to sequentially suspend operation, such is not necessarily the case. To resume operations, the system controller issues, for example, a PM_END command at 706 indicating the end of power management mode. Upon receiving the PM_END command, each respective die resumes operation with respect to each other based on a unique delay that can be defined during fabrication at 707-710 by a fixed trimmable delay and/or the die address.

Figure 8:
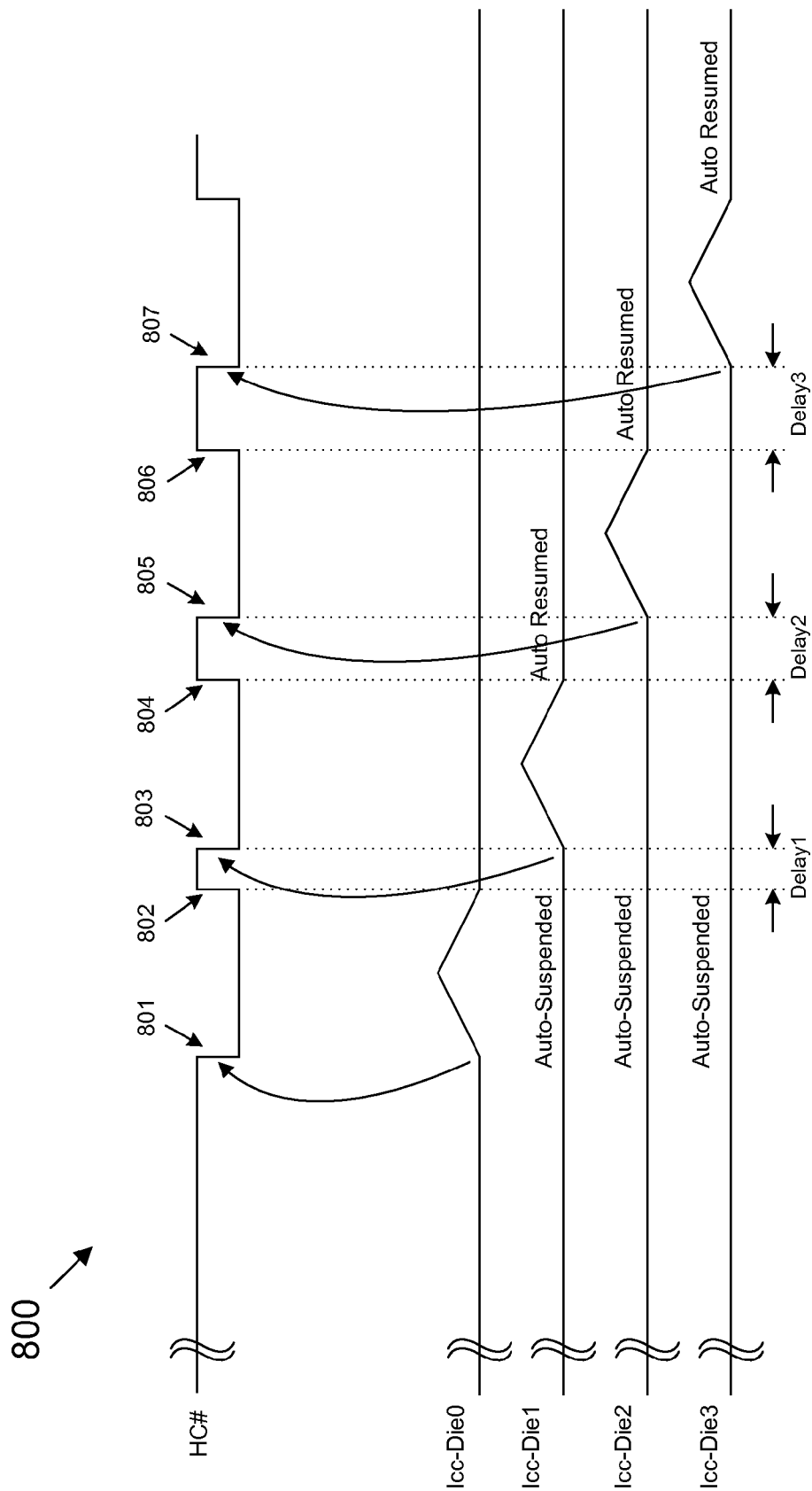
FIG. 8 depicts an exemplary timing diagram an auto-suspend and auto-resume mode for an exemplary four-die multi-chip NAND flash memory according to the subject matter disclosed herein.

FIG. 8 depicts an exemplary timing diagram 800 of an auto-suspend and auto-resume mode for an exemplary four-die multi-chip NAND flash memory according to the subject matter disclosed herein. It should be understood that a multi-chip NAND flash memory having a number of dies different from four dies could be used. As depicted in FIG. 8, Die0-Die3 are initially operating in a normal mode (i.e., not auto-suspended) until one die, for example, Die0 determines that a high-current operation is subsequent. For this particular example, because Die0 is not in an auto-suspended state, Die0 signals the detected subsequent high-current operation to the other die by, for example, pulling an HC# signal line low at 801. In one exemplary embodiment, the HC# signal line could be implemented similar to the R/B# signal line in FIG. 1. When signal HC# goes low at 801, the other die of the multi-die memory enter into an auto-suspend state based on, for example, executing operations corresponding to the flow diagram of FIG. 3 that indicate, for example, that a bit line (BL) precharge operation is to occur. Die currents Icc-Die0 through Icc-Die3 are indicated in FIG. 8 to be at a low-current state.

Die0 is fabricated to have zero delay after HC# goes low, and immediately performs the detected subsequent high-current operation. When Die0 is finished with the high-current operation, signal HC# is released at 802 causing Die1 to remain in the auto-suspended state for delay Delay1. At the end of Delay1, Die1 auto-resumes and determines that HC# should be pulled low at 803 to indicate that a high-current operation has been detected to be subsequent. When Die1 is finished with the high-current operation, signal HC# is released at 804 causing Die2 to remain in the auto-suspended state for delay Delay2. At the end of Delay2, Die3 auto-resumes and determines that HC# should be pulled low at 806 to indicate that a high-current operation has been detected to be subsequent. When Die3 is finished with the high-current operation, signal HC# is released at 807. The process continues in the same manner.

Figure 9:
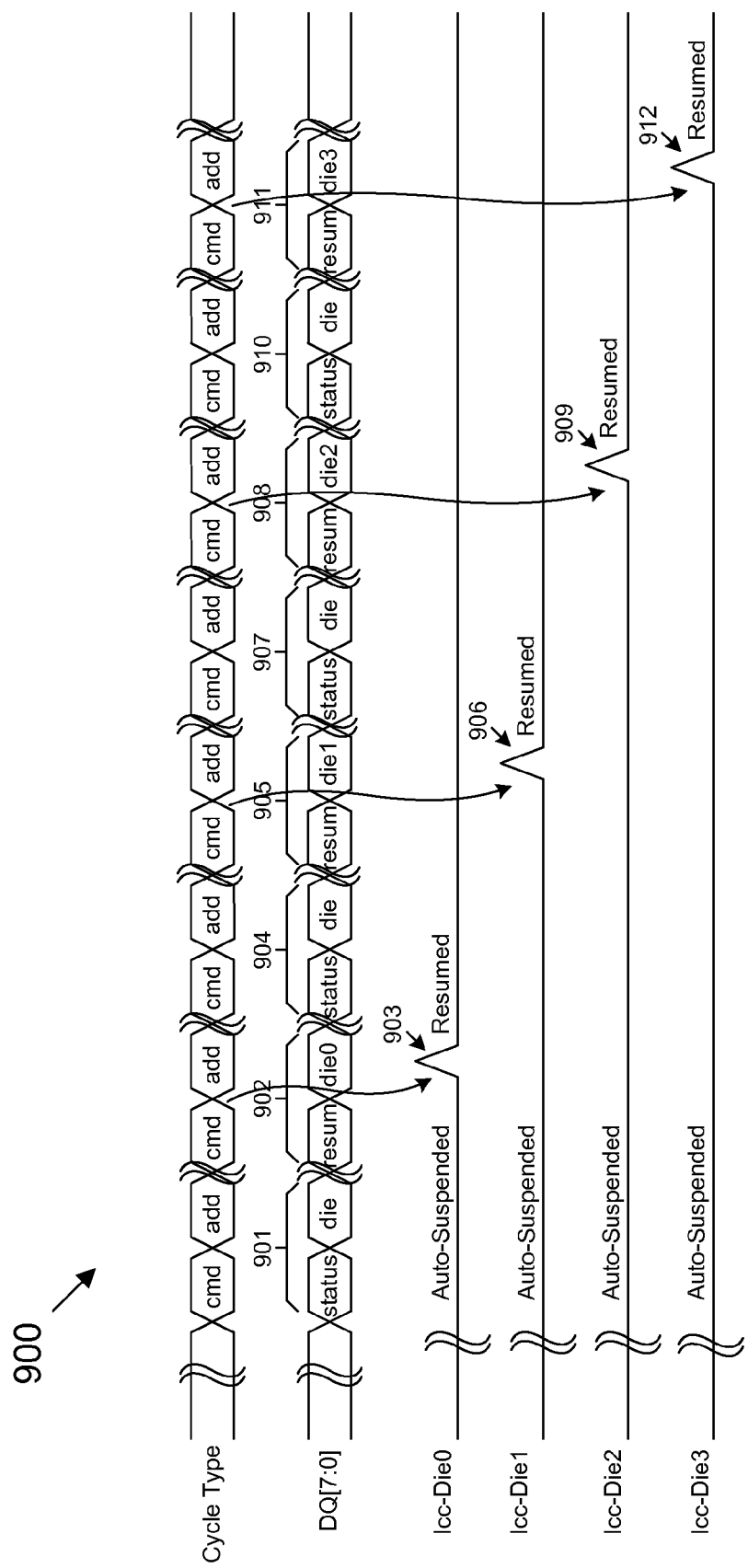
FIG. 9 depicts an exemplary timing diagram a resume operation command for an exemplary four-die multi-chip NAND flash memory according to the subject matter disclosed herein.

FIG. 9 depicts an exemplary timing diagram 900 of an resume operation command for an exemplary four-die multi-chip NAND flash memory according to the subject matter disclosed herein. It should be understood that a multi-chip NAND flash memory having a number of dies different from four dies could be used. As depicted in FIG. 9, Die0-Die3 are in an auto-suspend state based on, for example, executing operations corresponding to the flow diagram of FIG. 3 that indicate, for example, that a bit line (BL) precharge operation is to occur. Die currents Icc-Die0 through Icc-Die3 are indicated in FIG. 9 to be at a low-current state. Additionally, each die comprises a high-current register that stores an indicator whether the die is in an auto-suspend mode. Each high-current register can be read in a well-known manner by a system controller (host controller). Based on the indicated status in the high-current registers of the respective die, the system controller can determine the appropriate time to issue a resume command to a die.

As depicted in FIG. 9, the system controller reads the status of the high-current register of Die0 at 901, and issues a resume command at 902. In response to the resume command, Die0 resumes operation at 903 and a high-current condition occurs caused by a bit line precharge. The determination by the system controller to issue the resume command at 902 is based on, but not limited to, the overall peak-current conditions of the multi-die memory. At 904, the system controller reads the status of the high-current register of Die1, and issues a resume command at 905. In response to the resume command, Die1 resumes operation at 906 and a high-current condition occurs caused by a bit line precharge. At 907, the system controller reads the status of the high-current register of Die2, and issues a resume command at 908. In response to the resume command, Die2 resumes operation at 909 and a high-current condition occurs caused by a bit line precharge. At 910, the system controller reads the status of the high-current register of Die3, and issues a resume command at 911. In response to the resume command, Die3 resumes operation at 912 and a high-current condition occurs caused by a bit line precharge. Similar to the determination made by the system controller to issue the resume command at 902, the determinations made for the resume command issued at 905, 908 and 911 are based on, but not limited to, the overall peak-current conditions of the multi-die memory. The process continues with each respective die entering an auto-suspend state based on, for example, executing operations corresponding to the flow diagram of FIG. 3, and the system controller monitoring the status of the respective high-current registers.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

The invention claimed is:

1. A method, comprising:
   determining by at least one die of a multi-die memory whether a subsequent memory operation is a high-current memory operation;
   entering a suspended-operation mode by the at least one die if the subsequent memory operation is a high-current memory operation;
   resuming operation by the at least one die in response to a resume operation event;
   performing the subsequent memory operation;
   receiving a counter-reset signal from a controller of the multi-die memory;
   resetting an internal-die counter in response to the counter-reset signal;
   counting a first clock signal using the internal-die counter;
   resuming the operation by the at least one die in response to a predetermined count by the internal-die counter, the predetermined count of the internal-die counter comprising the resume operation event; and
   performing the subsequent memory operation.

2. The method according to claim 1, wherein said determining by the at least one die whether the subsequent memory operation is a high-current memory operation comprises determining whether the subsequent memory operation is an operation to enable a charge pump of the at least one die, an operation to charge a bit line of the at least one die, or a program/erase loop operation, or a combination thereof.

3. The method according to claim 1, wherein said determining by the at least one die whether the subsequent memory operation is a high-current memory operation further comprises outputting an indication to the multi-die memory of the subsequent memory operation.

4. The method according to claim 1, further comprising:
   receiving a command from a controller of the multi-die memory to enter a mode to determine whether the subsequent memory operation is a high-current memory operation; and
   in response to receiving the command, performing said determining by the at least one die of a multi-die memory whether the subsequent memory operation is a high-current memory operation.

5. The method according to claim 4, further comprising receiving a resume command from the controller specifically addressed to the at least one die, the resume command comprising the resume operation event;
in response to the resume command, performing said resuming operation by the at least one die in response to the resume command specifically addressed to the at least one die; and
performing the subsequent memory operation.

6. The method according to claim 1, wherein said performing the subsequent memory operation by the at least one die comprises delaying a predetermined period of time after receiving the second indication before preforming the subsequent memory operation.

7. The method according to claim 1, further comprising:
receiving a command from a controller of the multi-die memory to enter a mode to determine whether the subsequent memory operation is a high-current memory operation;
toggling a signal line in response to said determining by the at least one die whether the subsequent memory operation is a high-current memory operation;
performing the said resuming operation by the at least one die in response to a predetermined number of times the signal line is toggled, the predetermined number of times the signal line is togged comprising the resume operation event;
performing the subsequent memory operation; and
toggling the signal line in response to performing the subsequent memory operation.

8. The method according to claim 1, wherein the multi-die memory comprises a solid-state drive.

9. A method of controlling a peak-current condition in a solid-state drive, the method comprising:
determining by at least one die of the solid-state drive whether a subsequent memory operation is a high-current memory operation, the high-current memory operation comprising an operation to enable a charge pump of the at least one die, an operation to charge a bit line of the at least one die, or a program/erase loop operation, or a combination thereof;
entering a suspended-operation mode by the at least one die if the subsequent memory operation is a high current memory operation;
resuming operation by the at least one die in response to a resume operation event;
performing the subsequent memory operation;
receiving a counter-reset signal from a controller of the solid-state drive;
resetting an internal-die counter in response to the counter-reset signal; and
counting a first clock signal using the internal-die counter;
resuming the operation by the at least one die in response to a predetermined count by the internal-die counter, the predetermined count of the internal-die counter comprising the resume operation event; and
performing the subsequent memory operation.

10. The method according to claim 9, further comprising:
receiving a command from a controller of the solid-state drive to determine whether the subsequent memory operation is a high-current memory operation; and
in response to receiving the command, determining by the at least one die of a multi-die memory whether the subsequent memory operation is a high-current memory operation.

11. The method according to claim 10, further comprising:
receiving a resume command from the controller of the solid-state drive specifically addressed to the at least one die, the resume command comprising the resume operation event;
in response to the resume command, performing said resuming operation by the at least one die in response to the resume command specifically addressed to the at least one die; and
performing the subsequent memory operation.

12. The method according to claim 9, wherein determining by the at least one die whether the subsequent memory operation is a high-current memory operation further comprises outputting an indication to a multi-die memory of the subsequent memory operation.

13. The method according to claim 9, further comprising:
receiving a command from a controller of the solid-state drive to enter a mode to determine whether the subsequent memory operation is a high-current memory operation;
toggling a signal line in response to said determining by the at least one die whether the subsequent memory operation is a high-current memory operation;
performing said resuming operation by the at least one die in response to a predetermined number of times the signal line is toggled, the predetermined number of times the signal line is togged comprising the resume operation event;
performing the subsequent memory operation; and
toggling the signal line in response to performing the subsequent memory operation.

14. An apparatus, comprising:
at least one die of a multi-die memory configured to determine whether a subsequent memory operation is a high-current memory operation, the high-current memory operation comprising an operation to enable a charge pump of the at least one die, an operation to charge a bit line of the at least one die, or a program/erase loop operation, or a combination thereof;
the at least one die further configured to:
enter a suspended-operation mode by the at least one die if the subsequent memory operation is a high current memory operation,
toggle a signal line in response to the determining by the at least one die whether the subsequent memory operation is a high-current memory operation,
resume operation in response to a predetermined number of times the signal line is toggled by other dies of the multi-die memory, the predetermined number of times the signal line is toggled comprising a resume operation event,
perform the subsequent memory operation, and
toggle the signal line in response to performing the subsequent memory operation.

15. The apparatus according to claim 14, wherein the at least one die is further configured to receive a counter-reset signal from a controller of the multi-die memory, and in response to receiving the counter-reset signal, determine whether the subsequent memory operation is a high-current memory operation.

16. The apparatus according to claim 14, wherein the multi-die memory comprises a solid-state drive.

* * * * *

UNITED STATES PATENT AND TRADEMARK OFFICE
CERTIFICATE OF CORRECTION

| | | |
|---|---|---|
| PATENT NO. | : 9,443,600 B2 | Page 1 of 1 |
| APPLICATION NO. | : 13/852992 | |
| DATED | : September 13, 2016 | |
| INVENTOR(S) | : Ghalam et al. | |

It is certified that error appears in the above-identified patent and that said Letters Patent is hereby corrected as shown below:

In the claims,

Column 11, Claim 7, Line 23 delete "the" after the word performing.

Signed and Sealed this
Eighteenth Day of October, 2016

Michelle K. Lee
*Director of the United States Patent and Trademark Office*